United States Patent
Onódy et al.

(10) Patent No.: US 12,052,018 B2
(45) Date of Patent: Jul. 30, 2024

(54) DEGLITCHER WITH INTEGRATED NON-OVERLAP FUNCTION

(71) Applicant: Skyworks Solutions, Inc., Irvine, CA (US)

(72) Inventors: Péter Onódy, Budapest (HU); András V. Horváth, Budapest (HU)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/204,584

(22) Filed: Jun. 1, 2023

(65) Prior Publication Data

US 2024/0039519 A1  Feb. 1, 2024

Related U.S. Application Data

(63) Continuation of application No. 17/674,600, filed on Feb. 17, 2022, now Pat. No. 11,705,892, which is a continuation of application No. 17/125,561, filed on Dec. 17, 2020, now Pat. No. 11,258,432.

(51) Int. Cl.
| | |
|---|---|
| *H03K 5/125* | (2006.01) |
| *H03H 11/06* | (2006.01) |
| *H03H 11/26* | (2006.01) |
| *H03K 3/012* | (2006.01) |
| *H03K 5/1252* | (2006.01) |
| *H03K 17/687* | (2006.01) |
| *H03K 19/20* | (2006.01) |

(52) U.S. Cl.
CPC ......... *H03K 3/012* (2013.01); *H03K 17/6872* (2013.01); *H03K 17/6874* (2013.01); *H03K 19/20* (2013.01)

(58) Field of Classification Search
None
See application file for complete search history.

(56) References Cited

U.S. PATENT DOCUMENTS

| | | |
|---|---|---|
| 5,151,612 A | 9/1992 | Ishikawa |
| 5,815,030 A | 9/1998 | Wuidart et al. |
| 6,894,540 B1 | 5/2005 | Ali et al. |
| 7,391,241 B2 | 6/2008 | Rajasekhar et al. |
| 7,397,292 B1 | 7/2008 | Potanin |
| 7,409,659 B2 | 8/2008 | Chakraborty et al. |
| 8,319,524 B1 | 11/2012 | Cheng et al. |
| 8,487,647 B2 | 7/2013 | Lopez Rodriguez et al. |
| 9,071,206 B2 | 6/2015 | Cellier et al. |

(Continued)

*Primary Examiner* — Kenneth B Wells
(74) *Attorney, Agent, or Firm* — Knobbe, Martens, Olson & Bear, LLP

(57) ABSTRACT

A driver circuit includes a first deglitcher circuit that delays a rising edge or a falling edge of an input signal according to a mode control signal and supplies a first output signal. A second deglitcher circuit receives the first output signal and delays either a rising edge or a falling edge of the first output signal by a second delay according to the mode control signal and supplies a second output signal. Logic gates combine the first and second output signals to supply gate control signals for output transistors to drive the driver circuit output. A sum of the first delay and the second delay determines the total deglitch time defining a pulse width of pulses that are suppressed by the driver circuit and the second delay determines a non-overlap time. The non-overlap time overlaps in time with the total deglitch time.

20 Claims, 3 Drawing Sheets

(56) References Cited

U.S. PATENT DOCUMENTS

| | | | |
|---|---|---|---|
| 11,258,432 B1* | 2/2022 | Onódy | ............ H03K 19/018521 |
| 11,705,892 B2* | 7/2023 | Onódy | .................... H03K 19/20 |
| | | | 327/156 |
| 2022/0200580 A1 | 6/2022 | Onódy et al. | |

* cited by examiner

DEGLITCHER WITH INTEGRATED NON-OVERLAP FUNCTION

CROSS REFERENCE TO RELATED APPLICATIONS

This application is a continuation of U.S. patent application Ser. No. 17/674,600, filed Feb. 17, 2022, entitled "Deglitcher With Integrated Non-Overlap Function," which is a continuation of U.S. patent application Ser. No. 17/125,561, filed Dec. 17, 2020, entitled "Deglitcher With Integrated Non-Overlap Function," naming Peter Onody et al., as inventors, which application is incorporated herein by reference in its entirety.

BACKGROUND

Field of the Invention

This disclosure relates to output drivers and more specifically to the delay associated with deglitching and non-overlap functions for the output driver.

Description of the Related Art

FIG. 1A illustrates a signal chain of a conventional driver 100 that includes a deglitcher block 101 and a nonoverlap block 103. The deglitcher circuit 101 suppresses any glitches that are shorter than a predetermined time. The longer the predetermined time, the longer the delay of the deglitcher circuit. The nonoverlap block ensures that the output transistors M1 and M2 are not both on at the same time. Thus, when the logic level of input signal 102 transitions from high to low, the signal outp_b turns off the PMOS transistor M2 before the outn_b gate signal turns on the NMOS transistor M1. The nonoverlap block further ensures that when the input signal 102 transitions from 0 to 1, outn_b turns off the NMOS transistor M1 before outp_n turns on the PMOS transistor M2. Both the deglitcher block 101 and the non-overlap block 103 add significant signal propagation delay. Note that the "b" in the outn_b and outp_b signals indicate that the output value on out 105 is opposite of the values on outn_b and outp_b. Thus, when outn b=outp_b=0, out 105 is a logic 1 and when outn b=outp_b=1, out 105 is 0.

FIG. 1B illustrates the timing and the delays involved in the conventional driver circuit 100. The total driver delay includes the sum of the deglitcher delay ($t_{DGL}$) 121 and non-overlap delay ($t_{NOL}$) 123. The deglitcher delay 121 suppresses glitches and the non-overlap delay 123 ensures transistors M1 and M2 are not on at the same time. FIG. 1B illustrates the output signal 105 transitioning from 0 to 1. At 122 M1 turns off (outn_b goes low) and at 124 outp_b goes low turning on M2. On the 1 to 0 transition for out 105 the deglitcher delay $t_{DGL}$ is shown at 125 and the non-overlap delay tNoL is shown at 127. For non-overlap M2 turns off (outp_b goes high) at 128 before M1 turns on (outn_b goes high) at 130.

It would be desirable to reduce driver delay but current signal propagation delay solutions come with cost. For example, reducing the deglitcher delay will result a faster driver, but will also allow some unwanted glitches to pass through the driver. Thus, it would be desirable to reduce driver delay without affecting performance.

SUMMARY OF EMBODIMENTS OF THE INVENTION

Embodiments described herein reduce the total delay of a driver without performance loss, thus keeping the original deglitch time and ensuring non-overlap.

In one embodiment an apparatus includes a first deglitcher circuit that delays by a first delay either a rising edge of a first input signal or a falling edge of the first input signal according to a mode control signal and supplies a first output signal. A second deglitcher circuit receives the first output signal as a second input signal and delays by a second delay either a rising edge of the second input signal or a falling edge of the second input signal according to the mode control signal and supplies a second output signal. The second output signal is coupled to the first deglitcher circuit and the second deglitcher circuit as the mode control signal.

In another embodiment a method includes delaying by a first delay either a rising edge of a first input signal or a falling edge of the first input signal in a first deglitcher circuit according to a mode control signal and supplying a first output signal. The method further includes a second deglitcher circuit receiving the first output signal as a second input signal and delaying by a second delay either a rising edge of the second input signal or a falling edge of the second input signal according to the mode control signal and supplying a second output signal. The method further includes supplying the second output signal as the mode control signal.

In another embodiment a driver circuit includes a first deglitcher circuit that delays by a first delay, based at least in part on a first RC circuit, either a rising edge of a first input signal or a falling edge of the first input signal according to a mode control signal and supplies a first output signal. A second deglitcher circuit receives the first output signal as a second input signal and delays by a second delay, based at least in part on a second RC circuit, either a rising edge of the second input signal or a falling edge of the second input signal according to the mode control signal and supplies a second output signal. A combination of the first delay and the second delay determines a pulse width of pulses that are suppressed in the driver circuit and the second delay further determines a non-overlap time to ensure an output PMOS transistor and an output NMOS transistor are not on at the same time. The second output signal is coupled to the first deglitcher circuit and the second deglitcher circuit as the mode control signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein integrate the nonoverlap delay ($t_{NOL}$) into the deglitcher delay ($t_{DGL}$) to reduce the total driver delay by the nonoverlap delay. The approach described herein reduces the total delay of a driver, while keeping the driver performance unchanged.

Figure 2:
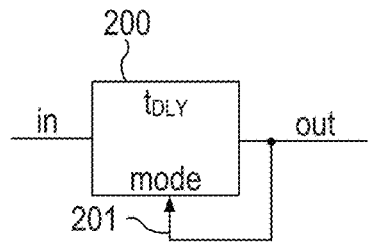
FIG. 2 illustrates a deglitcher circuit that includes a smart delay block.

FIG. 2 illustrates a deglitcher circuit 200 that includes a smart delay block, which can delay either the rising or falling edge of the input data, but only one of them at a time. The deglitcher circuit has two operational modes: (1) rising delay and (2) falling delay. The mode input 201 determines which operational mode is active. To operate as a deglitcher (glitch filter) the output state of the delay cell determines the operational mode. If both the input and the output of deglitcher circuit 200 are 0 then the rising edge is delayed, so any pulse length less than $t_{DLY}$ is suppressed and will not appear at the output, but the rising edge of longer pulses will pass the deglitcher circuit with a delay of $t_{DLY}$, and turn the deglitcher into falling delay mode. In falling delay mode, the operation is the same, but inverted, filtering the negative glitches (pulses) that last less than $t_{DLY}$.

As described above the non-overlap delay ($t_{NOL}$) ensures a delay between turning off the actual output device (M1 or M2) and turning on the other one (M2 or M1), to avoid a direct path between the supply rails.

Figure 3:
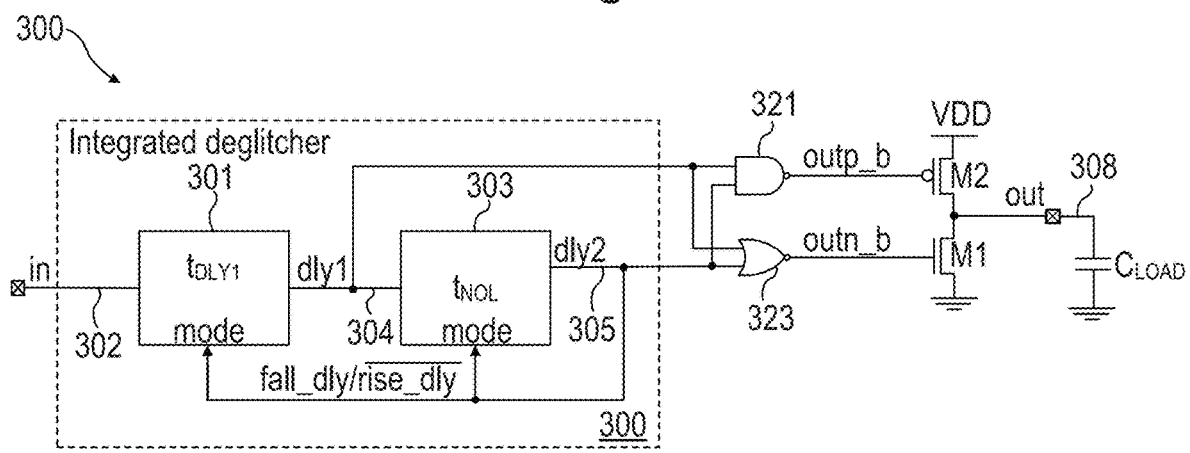
FIG. 3 illustrates an embodiment of an exemplary integrated deglitcher circuit.

Referring to FIG. 3, the exemplary integrated deglitcher 300 omits the dedicated nonoverlap delay block 103 with a delay of $t_{NOL}$ (see FIG. 1A.) and splits the deglitcher delay circuit into two parts $t_{DLY1}$ and $t_{NOL}$. Deglitcher block 301 with an input of 302 has a delay of $t_{DLY1}$ and deglitcher block 303 with an input of 304 has a delay of tNoL. The sum of the two delays provides the original deglitcher time $t_{DGL}$. In this case the output 305 from the second deglitcher block 303 provides the mode input for both deglitcher blocks 301 and 303, which determines whether the deglitcher blocks 301 and 303 provide falling edge delay (output 305=1) or rising edge delay (output 305=0) and therefore whether the deglitcher circuit suppresses glitches that are negative pulses or glitches that are positive pulses as explained further herein. In an embodiment the second delay tNoL equals the original nonoverlap delay (123, 127) shown in FIG. 1B, while the first delay is set to $t_{DLY1}=t_{DGL}-t_{NOL}$. The second delay cell is used as a base delay of the nonoverlap function. The delay between the dly1 and dly2 nodes is the core delay of the nonoverlap function, while also remaining part of the total deglitcher time. The signal on node dly1 and the signal on node dly2 are coupled to the NAND gate 321 and the NOR gate 323 to provide the gate drive signals (outp_b and outn_b) for transistors M2 and M1, which control the driver output 308.

Figure 4:
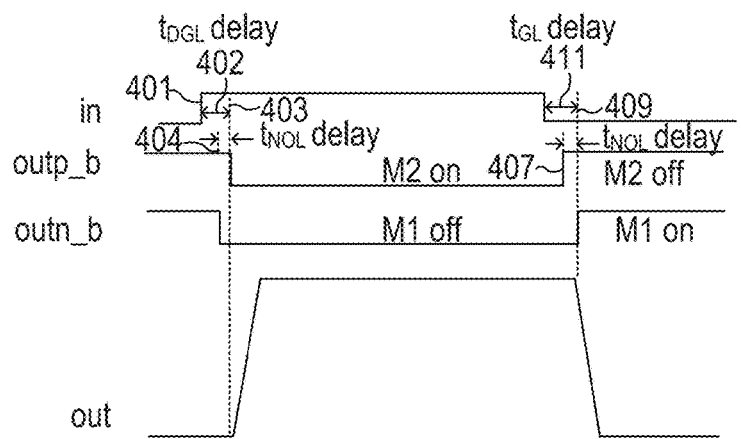
FIG. 4 illustrates the timing and the delays involved in the integrated deglitcher circuit.

FIG. 4 illustrates the timing of the integrated deglitcher 300. Assume the input 301 transitions from a logical 0 to logical 1 at 401. The deglitching delay $t_{DGL}$ 402 lasts from 401 to 403 and pulses smaller than $t_{DGL}$ are suppressed. The non-overlap delay lasts for tNoL beginning at 404 and lasting until 403. The non-overlap delay provides a delay between when M1 turns off and M2 turns on for 0 to 1 transitions. The non-overlap delay tNoL overlaps with a part of $t_{DGL}$ and thus the time for both the non-overlap delay tNoL and deglitch delay $t_{DGL}$ is $t_{DGL}$, thereby shortening the delay of the driver without impacting performance. Similarly, when the input 301 transitions from a logical 1 to a logical 0, the non overlap delay $t_{NOL}$ beginning at 407 and ending at 409 provides a delay between when M2 turns off and M1 turns on. The non overlap delay $t_{NOL}$ overlaps with a portion of the deglitch delay $t_{DGL}$ 411 thereby shortening the overall delay of the driver.

Figure 5:
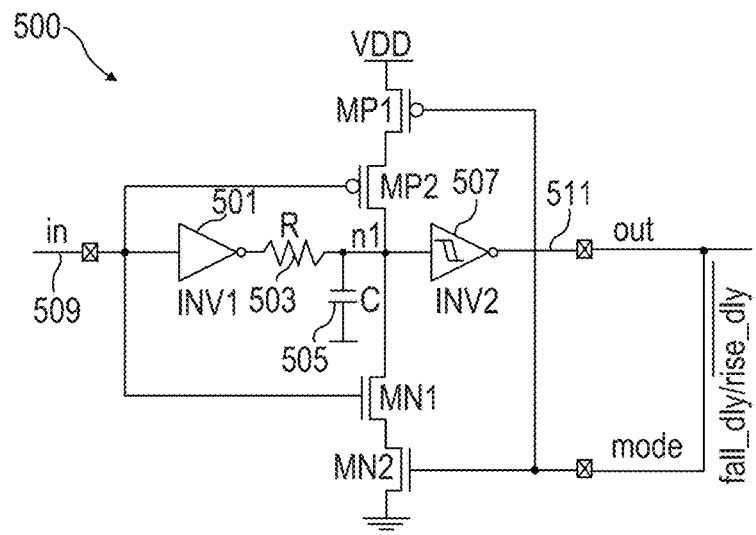
FIG. 5 illustrates an exemplary delay cell that can be used in the integrated deglitcher circuit.

FIG. 5 illustrates a delay cell 500, which is an embodiment of the deglitcher blocks 301 and 303. The inverter 501 (INV1), the resistor 503 (R), the capacitor 505 (C) and inverter 507 (INV2) implement a delay cell. The transistors MN1, MN2 and MP1, MP2 realize the mode control, to provide for the fast charge/discharge of the capacitor 505 to implement glitch suppression. Suppose that the input 509 ("in") is 0 (the capacitor 505 is charged up) and the mode is "0" (causing MN1 and MN2 to be off and MP1 and MP2 to be ON). If "in" 509 goes from low to high the capacitor 505 is slowly discharged through the resistor 503. If "in" 509 goes back to "0" before the voltage of the capacitor reaches the threshold of the inverter Schmitt trigger 507 (INV2 is implemented as an inverting Schmitt trigger device in FIG. 5) the output 511 stays low and the capacitor is quickly charged back through the series transistors MP1 and MP2 and therefore the capacitor is fully charged waiting for the next pulse. The RON of MP1 and MP2 should be significantly lower than the resistance of R 503 so the charging through MP1 and MP2 is much faster than the discharge through R. Thus, negative going pulses smaller than the RC time constant of the RC network formed by resistor 503 and capacitor 505 are suppressed when the input and mode are both "0".

Let's suppose "in" 509 is 1 (the capacitor 505 is discharged) and the mode is "1" resulting in MN1 and MN2 being ON and MP1 and MP2 being OFF. If "in" 509 goes from high to low, MN1 turns off and the capacitor 505 is slowly charged through the resistor 503. If "in" 509 goes back to "1" before the voltage of the capacitor reaches the Schmitt trigger threshold of inverter 507 the output 511 stays high and the capacitor is quickly discharged back through the series transistors MN1 and MN2 (and also through R) and therefore the capacitor is quickly fully discharged waiting for the next pulse. Thus, negative going pulses smaller than the RC time constant of the RC network formed by resistor 503 and capacitor 505 are suppressed when the input and mode are both "1".

Figure 1A:
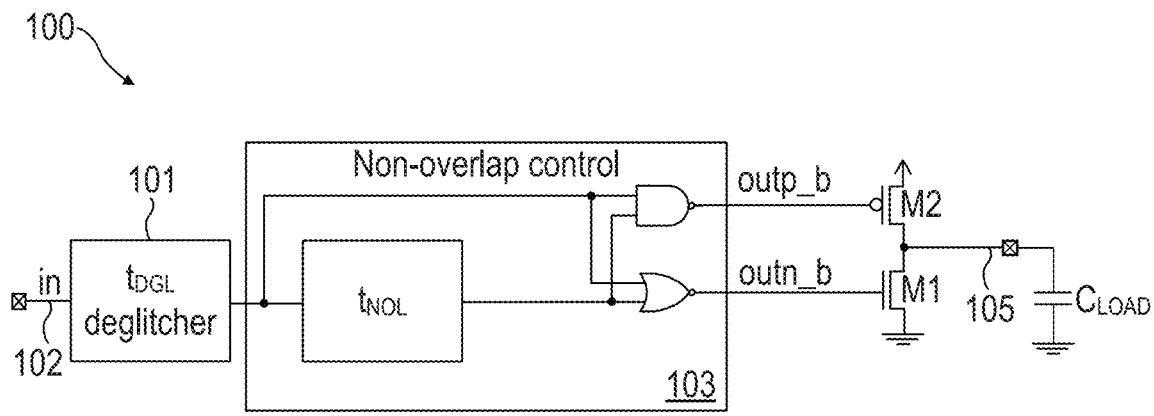
FIG. 1A illustrates a signal chain of a conventional driver
Figure 1B:
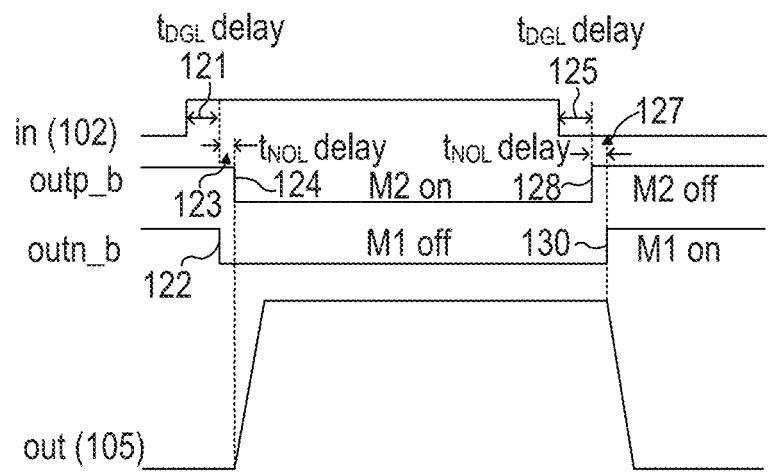
FIG. 1B illustrates the timing and the delays involved in the conventional driver circuit.
Figure 6:
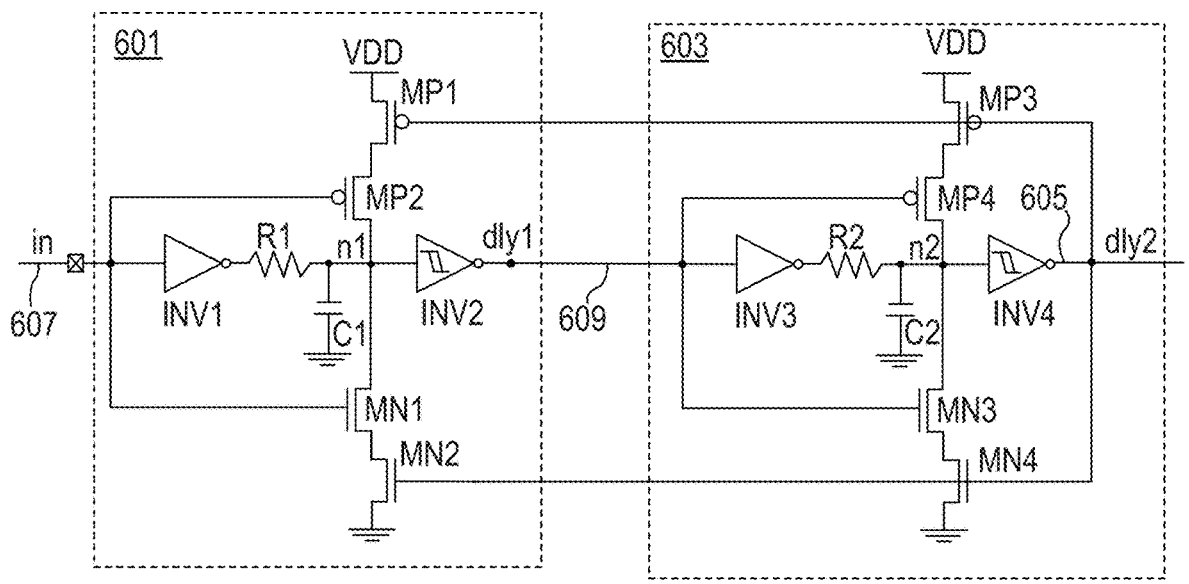
FIG. 6 illustrates an embodiment of an integrated deglitcher circuit using the exemplary delay cell.

FIG. 6 illustrates how two deglitcher circuits 601 and 603 are connected in series to provide for a more efficient driver circuit having the same deglitching and non-overlap capability as that of FIG. 1A. The output nodes dly1 and dly2 shown in FIG. 6 are coupled to the NOR gate 323 and NAND gate 321 as shown in FIG. 3. The output 605 of deglitcher circuit 603 is the mode signal provided to MP1, MP3, MN2, and MN4. Assume the input 607 to deglitcher circuit 601 is '0' and the output 605 (the mode signal) is also "0". In this case an input rising edge on input 607 has to pass through the RC network and is delayed by the RC time constant τ1 of R1C1 while a falling edge can bypass the RC network and directly drive the node n1 through the path provided by the series connected MP1 and MP2 transistors. The operation is the same when the input and output are 1, just vice-versa. That is, an input falling edge passes through the RC network and is delayed by τ1 while an input rising edge directly drives node n1 to ground through the series connected MN1 and MN2 transistors.

Deglitcher circuit 603 provides both the non-overlap delay through the time constant T2 provided by the RC network R2 and C2 and additional deglitching capability. The delay between the dly1 and dly2 nodes is the core delay of the nonoverlap function.

Assume the input 609 to deglitcher circuit 603 is '0' and the output 605 (the mode signal) is also "0". In this case an input rising edge on input 609 has to pass through the RC network R2C2 and is delayed by the RC time constant τ2 while a falling edge can bypass the RC network and directly drive the node n2 through the path provided by the series connected MP3 and MP4 transistors. The operation is the same when the input and output are 1, just vice-versa. That is, an input falling edge passes through the RC network and is delayed while an input rising edge directly drives node n2 to ground through the series connected MN3 and MN4 transistors.

In addition, the deglitcher circuit 603 provides an additional glitch suppression. Assume the deglitcher circuit 601 suppresses glitches having a pulse width up to T1 and assume for this example that $\tau1=\tau2$. That is, the RC networks R1C1 and R2C2 have equal component values. Assume the input 607 to deglitcher circuit 601 is '0' and the output 605 (the mode signal) is also "0". Assume that deglitcher circuit 601 receives a rising edge pulse that lasts for $(1.5\times\tau1)$. When the pulse returns to "0", the mode signal has not yet changed. INV2 switches from 0 to 1 after $\tau1$ but returns to 0 after $(-\tau1/2)$. Thus, deglitcher circuit 601 has shortened the negative going pulse from $(1.5\times\tau1)$ to $(\sim\tau1/2)$. Thus, deglitcher circuit 603 sees a pulse that is $(\tau1/2)$ and suppresses the pulse since it is less than $\tau2$. Thus, the deglitching times of deglitching circuits 601 and 603 add together to provide $t_{DGL}$ while the second half of $t_{DGL}$ also provides the nonoverlap function. Thus, the driver has the same deglitching and nonoverlap performance but with less delay due to the overlap shown in FIG. 4.

Note that the same deglitching occurs if the input is 1 and the mode is 1 and negative going pulse occurs. Assume the input 607 to deglitcher circuit 601 is '1" and the output 605 (the mode signal) is also "1". Assume that deglitcher circuit 601 receives a falling edge pulse that lasts for $(1.5\times\tau1)$. When the pulse returns to "1", the mode signal has not yet changed. INV2 switches from 1 to 0 after $\tau1$ but returns to 1 after $(\sim\tau1/2)$. Thus, deglitcher circuit 601 has shortened the negative going pulse from $(1.5\times\tau1)$ to $(\sim\tau1/2)$. Deglitcher circuit 603 sees a pulse that is $(\tau1/2)$ and suppresses the pulse since it is less than $\tau2$. Due to normal limitations of circuits and their operation the RC time constants may not be perfectly matched. In addition, stray capacitance and resistance in the deglitching circuits contributes to the delay and the other components of deglitching circuits cause additional delay in the transmission of the signal. Nevertheless, the RC time constants are the dominant factor in determining the delays through the deglitching circuits.

While the RC networks can have the same time constants such that $\tau1=\tau2$, other embodiments use different delays through the deglitching circuit 601 and 603. In addition, in some embodiments the delays are programmable by using variable resistors and/or variable capacitors for R1C1 and R2C2 to set the RC time constants to a desired value for a particular application.

Thus, a deglitching circuit that shortens driver delay while maintaining performance has been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A driver device comprising:
   a first deglitcher circuit and a second deglitcher circuit, each including a delay circuit and each configured, in response to a mode control signal being a first value, to delay rising edges of an input signal with the delay circuit and to bypass the delay circuit for falling edges of the input signal, and responsive to the mode control signal being a second value, to delay falling edges of the input signal with the delay circuit and to bypass the delay circuit for rising edges of the input signal, the first deglitcher circuit coupled to supply a first output signal as the input signal to the second deglitcher circuit, and the second deglitcher circuit coupled to supply a second output signal as the mode control signal to both of the first deglitcher circuit and the second deglitcher circuit.

2. The driver device of claim 1 further comprising:
   a first logic gate coupled to receive the first output signal and the second output signal as input signals and supply a first gate control signal;
   a second logic gate coupled to receive the first output signal and the second output signal as input signals and supply a second gate control signal;
   a first output transistor coupled to the first gate control signal; and
   a second output transistor coupled to the second gate control signal.

3. The driver device of claim 1 wherein the delay circuit of each of the first deglitcher circuit and the second deglitcher circuit includes a first inverter circuit coupled to the input signal, a first resistor coupled between an output of the first inverter circuit and a first internal node, a first capacitor coupled between the first internal node and ground, and a second inverter circuit coupled between the first internal node and a first output node supplying the first output signal.

4. The driver device of claim 1 wherein the delay circuit of the first deglitcher circuit has a first delay and the delay circuit of the second deglitcher circuit has a second delay.

5. The driver device of claim 4 wherein the delay circuit of the first deglitcher circuit has a first resistor and a first capacitor having a first RC time constant, and the delay circuit of the second deglitcher circuit has a second resistor and a second capacitor having a second RC time constant.

6. The driver device of claim 4 wherein the first delay and the second delay are different.

7. The driver device of claim 1 wherein the first deglitcher circuit and the second deglitcher circuit form an integrated deglitcher without a dedicated nonoverlap delay block.

8. The driver device of claim 1 wherein the first deglitcher circuit and the second deglitcher circuit each further include a first transistor and a second transistor serially coupled between a power supply node and a first internal node, a gate of the first transistor being coupled to the mode control signal and a gate of the second transistor being coupled to the input signal, and a third transistor and a fourth transistor serially coupled between the first internal node and ground, a gate of the third transistor being coupled to the mode control signal and a gate of the fourth transistor being coupled to the input signal.

9. A driver device comprising:
   a first deglitcher circuit, responsive to a first value of a mode control signal, to delay by a first delay a rising edge of a first input signal to the first deglitcher circuit, and responsive to a second value of the mode control signal to delay a falling edge of the first input signal, wherein the first deglitcher circuit is configured to supply a first output signal; and
   a second deglitcher circuit coupled to receive the first output signal as a second input signal, the second deglitcher circuit being responsive to the first value of the mode control signal to delay a rising edge of the second input signal by a second delay, being responsive to the second value of the mode control signal to delay a falling edge of the second input signal, wherein the second deglitcher circuit is configured to supply a second output signal that is coupled to the first deglitcher circuit and to the second deglitcher circuit as the mode control signal, a combination of the first delay and the second delay determining a pulse width of pulses that are suppressed in the driver device.

10. The driver device of claim 9 wherein the second delay further determines a non-overlap time to prevent a first output transistor and a second output transistor from being on simultaneously.

11. The driver device of claim 10 further comprising:
a first logic gate coupled to logically combine the first output signal and the second output signal and configured to supply a first gate control signal for controlling the first output transistor;
a second logic gate coupled to logically combine the first output signal and the second output signal and configured to supply a second gate control signal for controlling the second output transistor.

12. The driver device of claim 10 wherein the first deglitcher circuit and the second deglitcher circuit form an integrated deglitcher without a dedicated nonoverlap delay block.

13. The driver device of claim 9 wherein the first delay is based at least in part on a first RC circuit in the first deglitcher circuit, and the second delay is based at least in part on a second RC circuit in the second deglitcher circuit.

14. An output driver comprising:
a first deglitcher circuit and a second deglitcher circuit, each including a delay circuit configured to delay a rising edge of an input signal responsive to a first value of a mode control signal and to delay a falling edge of the input signal responsive to a second value of the mode control signal, the first deglitcher circuit configured to supply a first output signal as an input to the second deglitcher circuit, the second deglitcher circuit configured to supply a second output signal as the mode control signal to both of the first deglitcher circuit and the second deglitcher circuit;
a first logic gate coupled to receive the first output signal and the second output signal and supply a first gate control signal;
a second logic gate coupled to receive the first output signal and the second output signal and supply a second gate control signal;
a first output transistor coupled to receive the first gate control signal; and
a second output transistor coupled to receive the second gate control signal, a second delay of the second deglitcher circuit determining a non-overlap time to prevent the first output transistor and the second output transistor from being on simultaneously.

15. The output driver of claim 14 wherein a combination of a first delay of the first deglitcher circuit and the second delay of the second deglitcher circuit determining a pulse width of pulses that are suppressed in the output driver.

16. The output driver of claim 15 wherein the first delay is based at least in part on a first RC circuit in the first deglitcher circuit, and the second delay is based at least in part on a second RC circuit in the second deglitcher circuit.

17. The output driver of claim 14 wherein the delay circuit of each of the first deglitcher circuit and the second deglitcher circuit includes a first inverter circuit coupled to the input signal, a first resistor coupled between an output of the first inverter circuit and a first internal node, a first capacitor coupled between the first internal node and ground, and a second inverter circuit coupled between the first internal node and a first output node supplying the first output signal.

18. The output driver of claim 14 wherein the delay circuit of the first deglitcher circuit has a first resistor and a first capacitor having a first RC time constant that at least partially determines a first delay of the delay circuit of the first deglitcher circuit, and the delay circuit of the second deglitcher circuit has a second resistor and a second capacitor having a second RC time constant that at least partially determines the second delay.

19. The output driver of claim 18 wherein the first delay and the second delay are different.

20. The output driver of claim 14 wherein the first deglitcher circuit and the second deglitcher circuit form an integrated deglitcher without a dedicated nonoverlap delay block.

* * * * *